(12) United States Patent
Lee

(10) Patent No.: US 9,954,009 B2
(45) Date of Patent: Apr. 24, 2018

(54) DISPLAY DEVICE

(71) Applicant: Samsung Display Co., Ltd., Yongin-si, Gyeonggi-do (KR)

(72) Inventor: Hyun Lee, Yongin-si (KR)

(73) Assignee: Samsung Display Co., Ltd., Gyeonggi-do (KR)

( * ) Notice: Subject to any disclaimer, the term of this patent is extended or adjusted under 35 U.S.C. 154(b) by 0 days.

(21) Appl. No.: 15/019,825

(22) Filed: Feb. 9, 2016

(65) Prior Publication Data

US 2017/0012056 A1    Jan. 12, 2017

(30) Foreign Application Priority Data

Jul. 10, 2015  (KR) .................. 10-2015-0098408

(51) Int. Cl.
*G09G 3/36* (2006.01)
*H01L 27/12* (2006.01)

(52) U.S. Cl.
CPC ........ *H01L 27/124* (2013.01); *H01L 27/1255* (2013.01)

(58) Field of Classification Search
None
See application file for complete search history.

(56) References Cited

U.S. PATENT DOCUMENTS

| 2003/0086046 | A1 | 5/2003 | You |
| 2003/0122762 | A1* | 7/2003 | Shin ...................... G02F 1/1345 345/93 |
| 2003/0122989 | A1* | 7/2003 | Park .................. G02F 1/133351 349/43 |
| 2007/0045617 | A1 | 3/2007 | Lee |
| 2013/0168704 | A1* | 7/2013 | Huang ................ H01L 27/1248 257/88 |
| 2014/0145153 | A1 | 5/2014 | Kim et al. |
| 2014/0240630 | A1 | 8/2014 | Jung |

FOREIGN PATENT DOCUMENTS

| KR | 10-2003-0038337 A | 5/2003 |
| KR | 10-2005-0003260 A | 1/2005 |
| KR | 10-2007-0024777 A | 3/2007 |
| KR | 10-2008-0030195 A | 4/2008 |
| KR | 10-2014-0067523 A | 6/2014 |
| KR | 10-2014-0082368 A | 7/2014 |
| KR | 10-2014-0106851 A | 9/2014 |

* cited by examiner

*Primary Examiner* — Ali Naraghi
(74) *Attorney, Agent, or Firm* — Knobbe, Martens, Olson & Bear, LLP

(57) ABSTRACT

A display device is disclosed. In one aspect, the display device includes a first wire disposed in the inactive area of the substrate, a first pad overlapping the first wire in the depth dimension of the display device, and a first connecting layer configured to electrically connect the first wire to the first pad. The display device also includes a second wire located on a different layer from the first wire, a second pad overlapping the second wire in the depth dimension of the display device, and a second connecting layer configured to electrically connect the second wire to the second pad.

20 Claims, 6 Drawing Sheets

DISPLAY DEVICE

CROSS-REFERENCE TO RELATED APPLICATION

This application claims the benefit of Korean Patent Application No. 10-2015-0098408, filed on Jul. 10, 2015, in the Korean Intellectual Property Office, the disclosure of which is incorporated herein in its entirety by reference.

BACKGROUND

Field

The described technology generally relates to a display device.

Description of the Related Technology

Recently, display devices have been used for various purposes. Flat panel displays such as organic light-emitting diode (OLED) displays and liquid crystal displays (LCDs) have achieved widespread popularity because they are thin and lightweight. A display device can be implemented with an active area displaying images that a user recognizes and a dead area (i.e., inactive area or non-display area); that is, an area that does not emit visible light. The dead area typically includes wires that are connected to the active area. The wires terminate at pads where components that drive the active area are mounted. Careful arrangement of wires, pads and insulating layers is important for the integrity of signals that are transmitted between the two areas.

SUMMARY OF CERTAIN INVENTIVE ASPECTS

One inventive aspect relates to a display device including pads disposed on a dead area.

Another aspect is a display device that includes: a substrate including an active area on which a plurality of pixels are arranged and a dead area adjacent to the active area; a first wire disposed on the dead area of the substrate; a first pad overlapping the first wire; a first connecting portion electrically connecting the first wire to the first pad; a second wire located at a different layer from the first wire and adjacent to the first wire; a second pad overlapping the second wire; and a second connecting portion electrically connecting the second wire to the second pad.

The first pad and the second pad may be located at different layers from each other.

The first connecting portion and the second connecting portion may be located at a same layer as each other.

The first wire and the second pad may be located at a same layer as each other, and the second wire and the first pad may be located at a same layer as each other.

The first connecting portion may be located over the first wire and the first pad, and the second connecting portion may be located over the second wire and the second pad.

A part of the first connecting portion may simultaneously contact the first wire and the first pad, and a part of the second connecting portion may simultaneously contact the second wire and the second pad.

The display device may further include: a first insulating layer disposed between the first wire and the first pad and comprising a first hole; and a second insulating layer disposed between the first pad and the first connecting portion and including a second hole, wherein the first hole and the second hole may overlap each other.

The first connecting portion may contact the first wire via the first hole and contact the first pad via the second hole.

The first pad may include a first through hole overlapping the first hole and the second hole.

The second hole may be larger than the first through hole.

The display device may further include: a first insulating layer disposed between the second pad and the second wire and including a third hole; and a second insulating layer disposed between the second wire and the second connecting portion and including a fourth hole, wherein the third hole and the fourth hole may overlap each other.

The second wire may include a second through hole overlapping the third hole and the fourth hole.

The fourth hole may be larger than the second through hole.

The display device may further include: a thin film transistor located on the active area, and including an active layer, a gate electrode, a source electrode, and a drain electrode; and a storage capacitor located on the active area, and including a first electrode, and a second electrode on the first electrode.

The first wire and the second pad may be located at a same layer as the gate electrode and the first electrode.

The second wire and the first pad may be located at a same layer as the second electrode.

The first wire and the second wire may be connected to signal lines passing through the active area.

The first pad and the second pad may be arranged in a first direction away from the active area.

A plurality of the first pads and a plurality of the second pads may be alternately arranged with each other in the first direction.

A plurality of the first wires and a plurality of the second wires may be alternately arranged with each other.

Another aspect is a display device, comprising: a substrate comprising an active area including a plurality of pixels and an inactive area adjacent to the active area; a first wire disposed in the inactive area of the substrate; a first pad overlapping the first wire in the depth dimension of the display device; a first connecting layer configured to electrically connect the first wire to the first pad; a second wire located on a different layer from the first wire, wherein the second wire is located adjacent to the first wire; a second pad overlapping the second wire in the depth dimension of the display device; and a second connecting layer configured to electrically connect the second wire to the second pad.

In the above display device, the first and second pads are located on different layers.

In the above display device, the first and second connecting layers are located on the same layer.

In the above display device, the first wire and the second pad are located on the same layer, wherein the second wire and the first pad are located on the same layer.

In the above display device, the first connecting layer is located over the first wire and the first pad, wherein the second connecting layer is located over the second wire and the second pad.

In the above display device, the first connecting layer contacts the first wire and the first pad, wherein the second connecting layer contacts the second wire and the second pad.

The above display device further comprises: a first insulating layer interposed between the first wire and the first pad, wherein the first insulating layer has a first hole; and a second insulating layer interposed between the first pad and the first connecting layer, wherein the second insulating layer has a second hole, and wherein the first and second holes overlap each other in the depth dimension of the display device.

In the above display device, the first connecting layer contacts the first wire via the first hole and contacts the first pad via the second hole.

In the above display device, the first pad has a first through hole overlapping the first and second holes in the depth dimension of the display device.

In the above display device, the second hole is larger than the first through hole.

The above display device further comprises: a first insulating layer interposed between the second pad and the second wire, wherein the first insulating layer has a third hole; and a second insulating layer interposed between the second wire and the second connecting layer, wherein the second insulating layer has a fourth hole, and wherein the third and fourth holes overlap each other in the depth dimension of the display device.

In the above display device, the second wire has a second through hole overlapping the third and fourth holes in the depth dimension of the display device.

In the above display device, the fourth hole is larger than the second through hole.

The above display device further comprises: a thin film transistor located on the active area and comprising an active layer, a gate electrode, a source electrode, and a drain electrode; and a storage capacitor located on the active area and comprising a first electrode and a second electrode disposed on the first electrode.

In the above display device, the first wire and the second pad are located on the same layer as the gate electrode and the first electrode.

In the above display device, the second wire and the first pad are located on the same layer as the second electrode.

In the above display device, the first and second wires are electrically connected to signal lines passing through the active area.

In the above display device, the first pad comprises a plurality of first pads, wherein the second pad comprises a plurality of second pads, wherein the first pads and the second pads are alternately arranged in a first direction.

In the above display device, the first wire includes a plurality of first wires, wherein the second wire includes a plurality of second wires, and wherein the first wires and the second wires are alternately arranged.

Another aspect is a display device, comprising: a substrate comprising a display area including a plurality of pixels and a non-display area adjacent to the display area; first and second wires disposed in the non-display area and located on different layers formed over the substrate; a first pad overlapping the first wire in the depth dimension of the display device; a second pad overlapping the second wire in the depth dimension of the display device, a first connecting layer configured to electrically connect the first wire to the first pad; and a second connecting layer configured to electrically connect the second wire to the second pad, wherein the first and second wires are alternately arranged in parallel, and wherein the first and second pads are alternately arranged at corresponding ends of the first and second wires.

DETAILED DESCRIPTION OF CERTAIN INVENTIVE EMBODIMENTS

Figure 1:
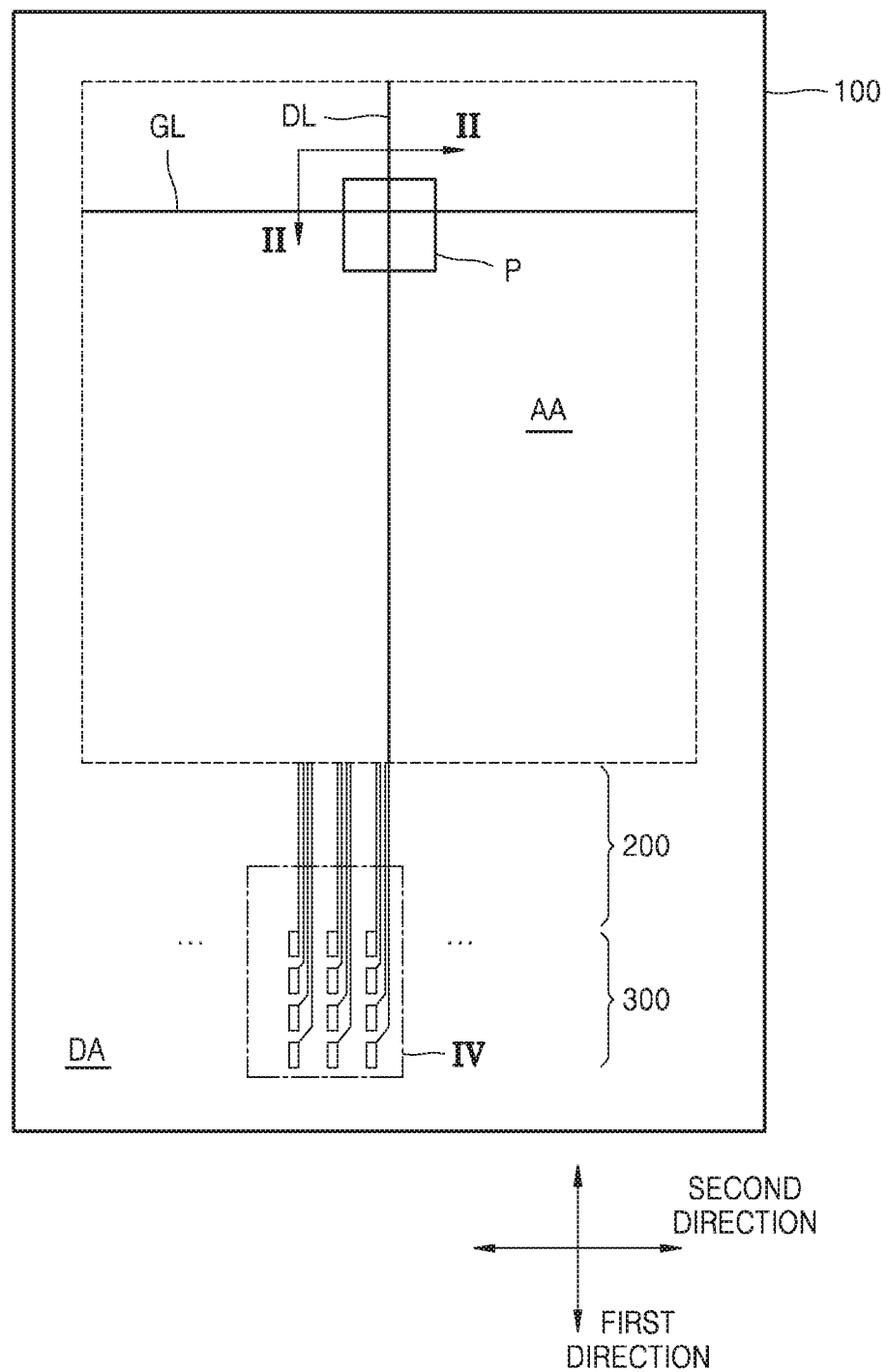
FIG. 1 is a schematic diagram of a display device according to an exemplary embodiment.

As the described technology allows for various changes and numerous embodiments, particular embodiments will be illustrated in the drawings and described in detail in the written description. However, this is not intended to limit the described technology to particular modes of practice, and it is to be appreciated that all changes, equivalents, and substitutes that do not depart from the spirit and technical scope are encompassed in the described technology. In the description, certain detailed explanations of the related art are omitted when it is deemed that they may unnecessarily obscure the essence of the described technology.

Hereinafter, the described technology will be described in detail by explaining preferred embodiments of the described technology with reference to the attached drawings. Like reference numerals in the drawings denote like elements.

It will be understood that although the terms "first," "second," etc. may be used herein to describe various components, these components should not be limited by these terms. These components are only used to distinguish one component from another.

As used herein, the singular forms "a," "an" and "the" are intended to include the plural forms as well, unless the context clearly indicates otherwise.

It will be further understood that the terms "comprises" and/or "comprising" used herein specify the presence of stated features or components, but do not preclude the presence or addition of one or more other features or components.

It will be understood that when a layer, region, or component is referred to as being "formed on" another layer, region, or component, it can be directly or indirectly formed on the other layer, region, or component. That is, for example, intervening layers, regions, or components may be present.

Sizes of components in the drawings may be exaggerated for convenience of explanation. In other words, since sizes and thicknesses of components in the drawings are arbitrarily illustrated for convenience of explanation, the following embodiments are not limited thereto.

When a certain embodiment may be implemented differently, a specific process order may be performed differently from the described order. For example, two consecutively described processes may be performed substantially at the same time or performed in an order opposite to the described order.

Throughout the specification, it will also be understood that when an element such as layer, region, or component is referred to as being "connected to" or "coupled with" another element, it can be directly connected to or coupled with the other element, or intervening elements may also be present. For example, throughout the specification, when an element such as layer, region, or component is referred to as being "electrically connected to" or "electrically coupled with" another element, it can be directly and electrically connected to or coupled with the other element, or intervening elements may also be present.

As used herein, the term "and/or" includes any and all combinations of one or more of the associated listed items. Expressions such as "at least one of," when preceding a list of elements, modify the entire list of elements and do not modify the individual elements of the list. In this disclosure, the term "substantially" includes the meanings of completely, almost completely or to any significant degree under some applications and in accordance with those skilled in the art.

Figure 2:
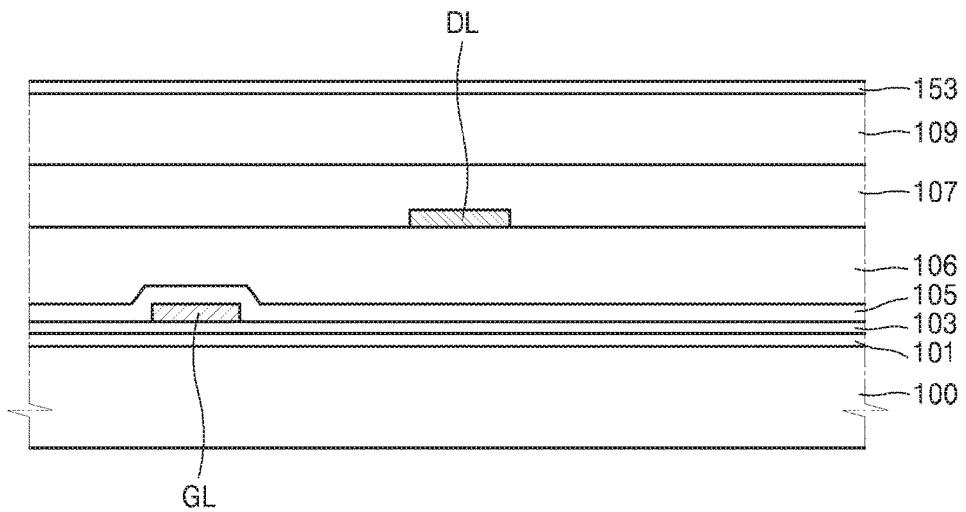
FIG. 2 is a cross-sectional view of the display device taken along the line II-II of FIG. 1.
Figure 3:
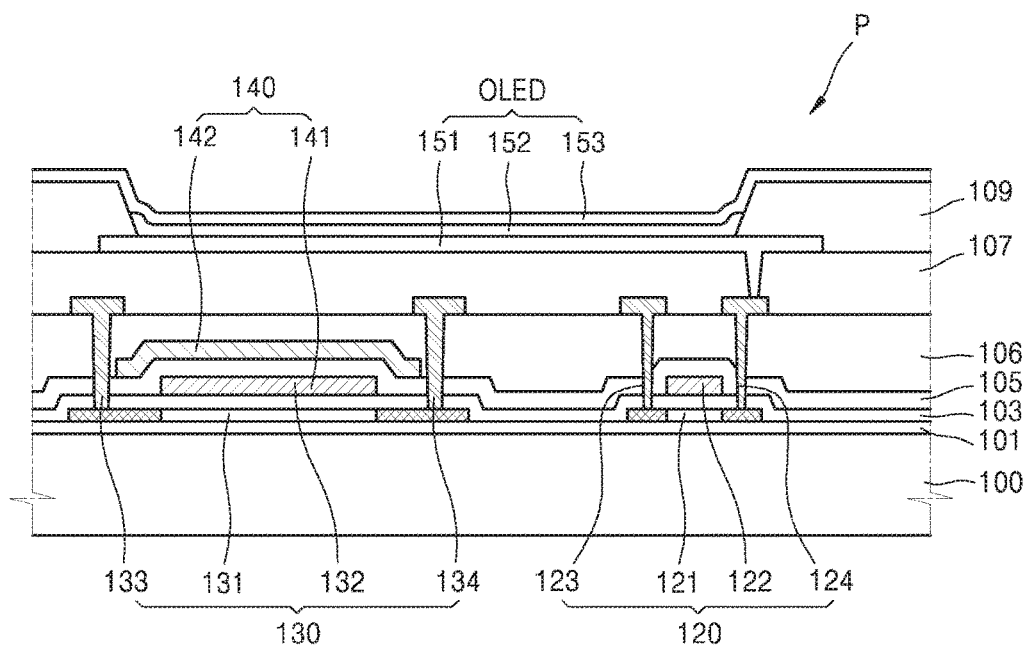
FIG. 3 is a cross-sectional view showing a pixel of FIG. 1.

FIG. 1 is a schematic diagram of a display device according to an exemplary embodiment. FIG. 2 is a cross-sectional view of the display device taken along the line II-II of FIG. 1. FIG. 3 is a cross-sectional view showing a pixel of FIG. 1.

Referring to FIG. 1, the display device according to one or more exemplary embodiments includes an active area (or display area) AA and a dead area (or non-display area) DA on a substrate 100. According to the exemplary embodiment, an encapsulation substrate (not shown) facing the substrate 100 is formed on the substrate 100. A sealant located on the dead area DA and surrounding the active area AA in order to seal the active area AA against external air may be disposed between the substrate 100 and the encapsulation substrate. According to another exemplary embodiment, a thin film encapsulation film (not shown) including an organic layer and an inorganic layer is formed on the substrate 100 to seal the active area AA, instead of the encapsulation substrate and the sealant.

The active area AA is an area displaying images, and various kinds of signal lines and pixels P connected to the signal lines are arranged on the active area AA. The various kinds of signal lines may include data lines DL and gate lines GL across the active area AA, and the pixels P may be arranged at intersections where the data lines DL and the gate lines GL cross each other.

Referring to FIGS. 1 and 2, the gate lines GL are arranged on a buffer layer 101 and a gate insulating layer 103, and extend in a second direction. According to an exemplary embodiment, the gate lines GL are connected to a gate driver (not shown) or an emission control driver (not shown) to receive scan signals or emission control signals, but is not limited thereto.

Referring to FIGS. 1 and 2, the data lines DL are electrically insulated from the gate lines GL by a first insulating layer 105 and a second insulating layer 106, and extend in a first direction. The data lines DL are electrically connected to a driver integrated circuit (IC) (not shown) mounted on a pad portion 300 via wires disposed on a fanout portion 200. For example, the data lines DL receive data signals from the driver IC via the wires on the fanout portion 200.

The pixels P are disposed on portions where the gate lines GL and the data lines DL cross each other, and each may include a pixel circuit and an OLED. The pixels P may emit red light, green light, and blue light, but are not limited thereto. As another exemplary embodiment, each of the pixels P emits white light. As another exemplary embodiment, each of the pixels P emits light of different combinations of colors for realizing full-color.

Each pixel P includes the OLED emitting light of a luminance according to a driving current corresponding to the data signal, and the pixel circuit may control the OLED based on the driving current provided to the OLED. The pixel circuit may include a plurality of thin film transistors, e.g., first and second thin film transistors 120 and 130, and a storage capacitor 140.

Referring to FIG. 3, the buffer layer 101 is formed on the substrate 100, and the thin film transistors, e.g., the first and second thin film transistors 120 and 130, and the storage capacitor 140 is formed on the buffer layer 101.

The substrate 100 may be formed of a metal material or a plastic material such as polyethylene terephthalate (PET), polyethylene naphthalate (PEN), polyimide, etc. If the substrate 100 includes a plastic material or a metal material, the substrate 100 may be flexible. The buffer layer 101 is formed on the substrate 100 in order to prevent impurities from infiltrating into the substrate 100, and may include $SiO_2$ and/or SiNx.

The thin film transistors, e.g., the first and second thin film transistors, include switching thin film transistors and driving thin film transistors. The first thin film transistor 120 may be a switching thin film transistor, and the second thin film transistor 130 may be a driving thin film transistor. The first and second thin film transistors 120 and 130 may respectively include active layers 121 and 131, gate electrodes 122 and 132 formed on the active layers 121 and 131 with the gate insulating layer 103 interposed between the gate electrodes 122 and 132 and the active layers 121 and 131, source electrodes 123 and 133, and drain electrodes 124 and 134.

The active layers 121 and 131 may each be formed of a silicon-based semiconductor material such as amorphous silicon or polysilicon, or an oxide semiconductor material including oxide such as indium (In), gallium (Ga), tin (Sn), hafnium (Hf), zinc (Zn), etc. According to some exemplary embodiments, P-type or N-type dopant may be injected into the active layers 121 and 131. The gate insulating layer 103 may be formed of an organic material or an inorganic material having an electric insulating property. For example, the gate insulating layer 103 is formed of $SiO_2$ and/or SiNx.

The gate electrodes 122 and 132 are partial regions of the gate lines GL, and may overlap the active layers 121 and 131. According to the exemplary embodiment, the gate electrodes 122 and 132 may be located respectively on the active layers 121 and 131 with the gate insulating layer 103 interposed therebetween. In FIG. 3, the gate electrodes 122 and 132 are disposed on the active layers 121 and 131, but are not limited thereto. According to another exemplary embodiment, the gate electrodes 122 and 132 are respectively located under the active layers 121 and 131 with the gate insulating layer 103 interposed therebetween. The gate electrodes 122 and 132 may be formed of one or more metal materials selected from aluminum (Al), platinum (Pt), palladium (Pd), silver (Ag), magnesium (Mg), gold (Au), nickel (Ni), neodymium (Nd), iridium (Jr), chromium (Cr), calcium (Ca), molybdenum (Mo), titanium (Ti), tungsten (W), and copper (Cu) and may have a single-layered or multi-layered structure.

The source electrodes 123 and 133 and the drain electrodes 124 and 134 are formed on the same layer, and are insulated from the gate electrodes 122 and 132 by the first insulating layer 105 and the second insulating layer 106 that are interposed therebetween. According to the exemplary embodiment, the source electrodes 123 and 133 and the drain electrodes 124 and 134 are formed on the same layer as the data lines DL.

The first insulating layer 105 and the second insulating layer 106 may be formed of an organic material or an inorganic material having an electric insulating property. For example, the first insulating layer 105 and/or the second insulating layer 106 are formed of $SiO_2$ and/or SiNx and have a single-layered or multi-layered structure.

The source electrodes 123 and 133 and the drain electrodes 124 and 134 may each be formed of one or more metal materials selected from Al, PT, Pd, Ag, Mg, Au, Ni, Nd, Jr, Cr, Ca, Mo, Ti, W, and Cu, and may have a single-layered or multi-layered structure.

In some exemplary embodiments, the storage capacitor 140 overlaps the second thin film transistor 130. A first electrode 141 and a second electrode 142 of the storage capacitor 140 overlap each other with the first insulating layer 105 interposed between the first and second electrodes 141 and 142. According to some exemplary embodiments, the first electrode 141 is a gate electrode 132 of the second thin film transistor 130. The second electrode 142 may be disposed under the source electrode 133 and the drain electrode 134 with the second insulating layer 106 interposed between the second electrode 142 and the source and drain electrodes 133 and 134.

A pixel electrode 151 may be connected to any one of the source electrode 133 and the drain electrode 134 of the first thin film transistor 130 with a planarization layer 107 between the pixel electrode 151 and the source and drain electrodes 133 and 134. A pixel-defining layer 109 exposing the pixel electrode 151 is formed on the pixel electrode 151, and an intermediate layer 152 including an organic emission layer and an opposite electrode 153 may be sequentially formed on the pixel electrode 151. If an OLED including the pixel electrode 151, the intermediate layer 152, and the opposite electrode 153 displays full color, the organic emission layer may include red, green, and blue emission materials in each pixel. In another exemplary embodiment, the organic emission layer includes a single layer including red, green, and blue emission materials so as to emit white light, or multiple layers in which red, green, and blue emission materials are stacked. If the organic emission layer emits white light, the organic emission layer may further include a color filter (not shown) to realize full-color.

Referring back to FIG. 1, the dead area DA may be adjacent to the active area AA. According to the exemplary embodiment, the dead area DA may surround the active area AA, but is not limited thereto. In another exemplary embodiment, the dead area DA may partially surround the active area AA. For example, the dead area DA may be disposed under the active area AA. The fanout portion 200 and the pad portion 300 connecting the active area AA to a driver IC are disposed on the dead area DA.

The driver IC may include a data driver for supplying data signals to pixels P. The driver IC is a chip-on-glass (COG) type mounted on the substrate 100. For example, the driver IC includes a connection terminal that is electrically connected to the pad portion 300 formed on the substrate 100. The connection terminal of the driver IC and the pad portion 300 of the substrate 100 may be electrically connected to each other via an adhesive material including a conductive ball. The adhesive material may be, for example, an anisotropic conductive film, a self organizing conductive film, etc.

The pad portion 300 includes a plurality of pads connected to the driver IC and connected to fanout wires (hereinafter, referred to as wires) of the fanout portion 200. The wires are connected to signal lines (e.g., data lines DL) passing through the active area AA, and each of the wires may be respectively connected to each of the pads. Hereinafter, the dead area DA will be described in more detail with reference to FIGS. 4 to 8.

Figure 4:
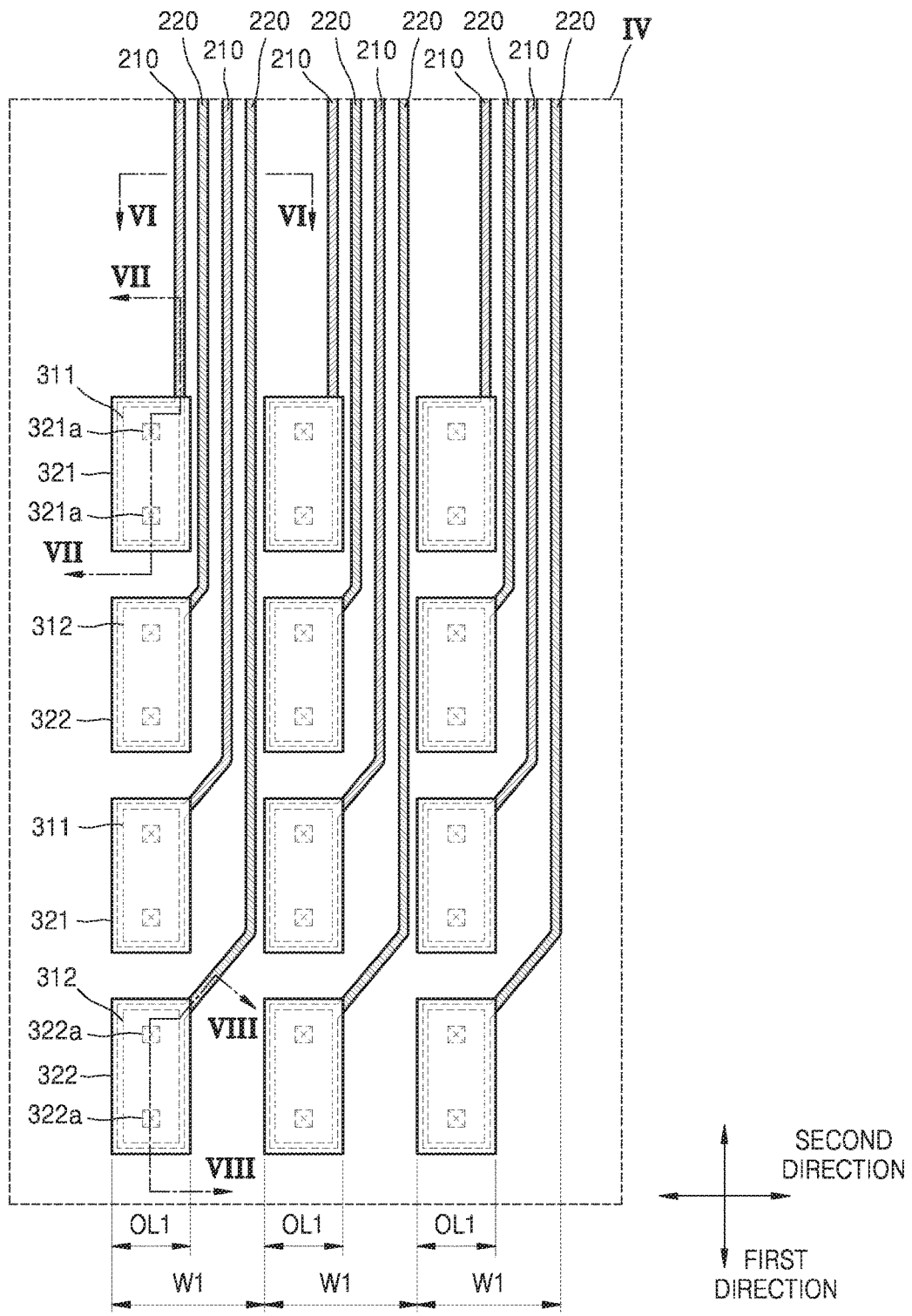
FIG. 4 is an enlarged view of the region IV of FIG. 1.
Figure 5:
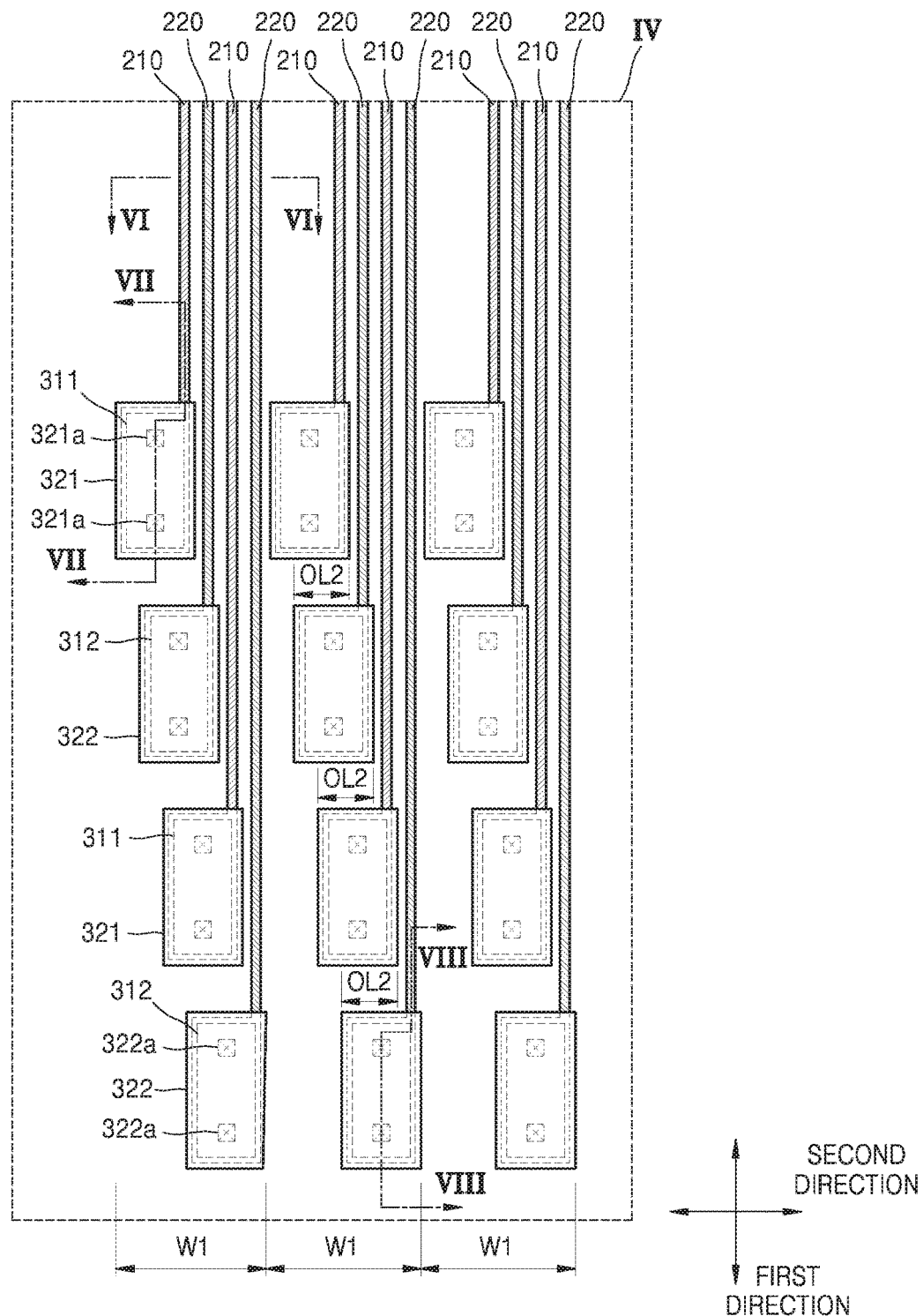
FIG. 5 is a diagram illustrating a dead area according to another exemplary embodiment.
Figure 6:
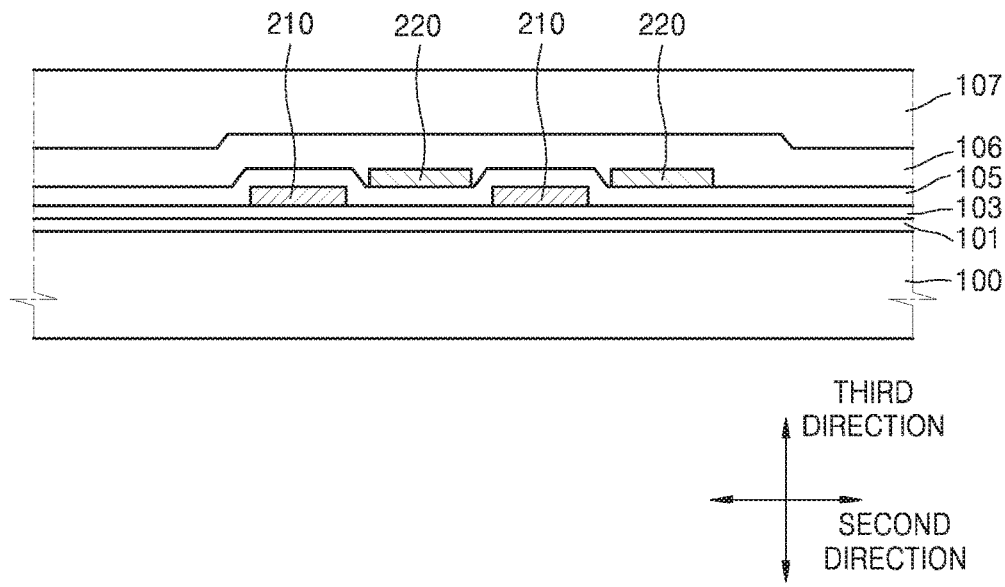
FIG. 6 is a cross-sectional view of the dead area taken along the line VI-VI of FIGS. 4 and 5.
Figure 7:
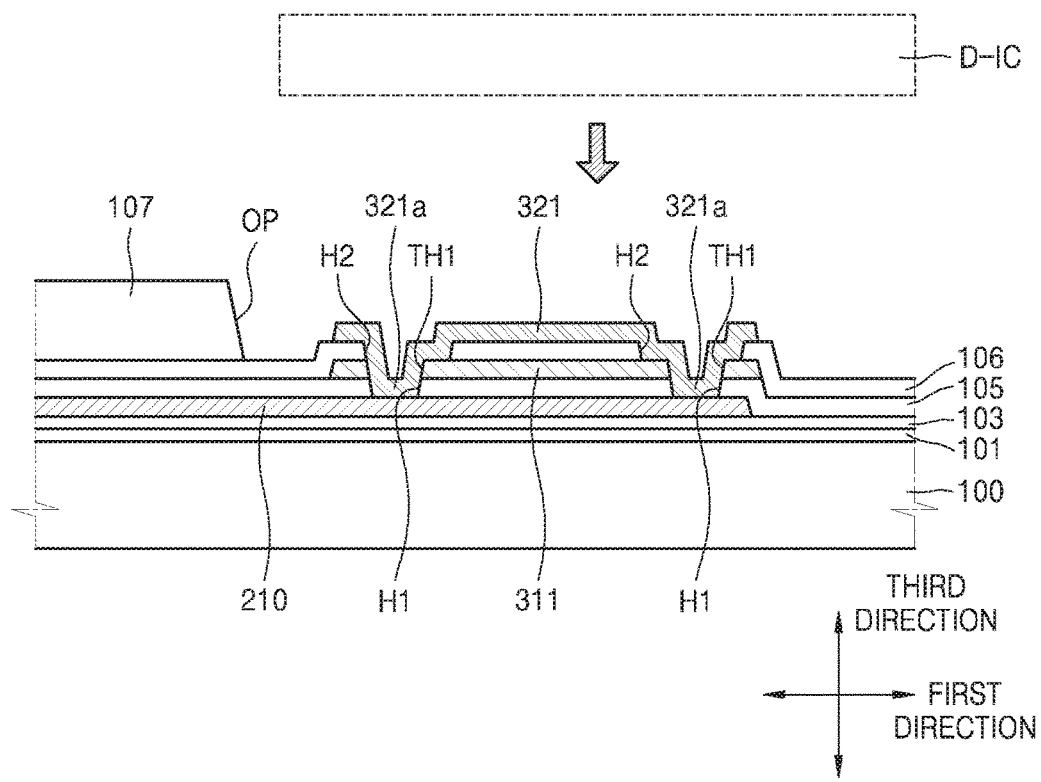
FIG. 7 is a cross-sectional view of the dead area taken along the line VII-VII of FIGS. 4 and 5.
Figure 8:
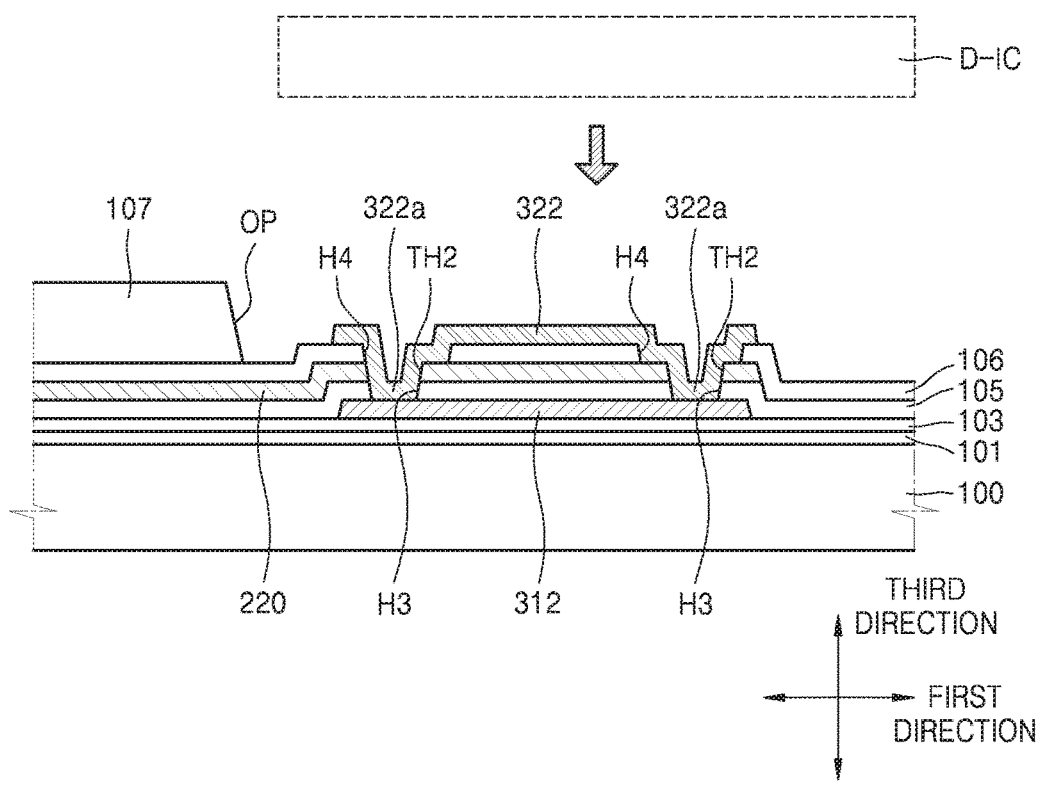
FIG. 8 is a cross-sectional view of the dead area taken along the line VIII-VIII of FIGS. 4 and 5.

FIG. 4 shows an enlarged view of the region IV of FIG. 1. FIG. 5 is a diagram of a dead area according to another exemplary embodiment. FIG. 6 is a cross-sectional view of the dead area DA taken along the line VI-VI of FIGS. 4 and 5. FIG. 7 is a cross-sectional view of the dead area DA taken along the line VII-VII of FIGS. 4 and 5. FIG. 8 is a cross-sectional view of the dead area DA taken along the line VIII-VIII of FIGS. 4 and 5.

Referring to FIGS. 4 and 6, the fanout portion 200 includes first wires 210 and second wires 220, and the pad portion 300 includes first pads 311 and second pads 312. The first wires 210 and the second wires 220 extend in the first direction, and are adjacent to each other. The first wires 210 and the second wires 220 may be alternately arranged with each other. For example, the first wires 210 and the second wires 220 are alternately arranged along the second direction, and are located on different layers from each other.

According to the exemplary embodiment, each of the first wires 210 is located between the gate insulating layer 103 and the first insulating layer 105, e.g., on the same layer as the gate electrodes 122 and 132 of the first and second thin film transistors 120 and 130 and/or the first electrode 141 of the storage capacitor 140. Each of the second wires 220 may be located between the first insulating layer 105 and the second insulating layer 106, e.g., on the same layer as the second electrode 142 of the storage capacitor 140.

The first pads 311 are connected respectively to the first wires 210, and the second pads 312 are connected respectively to the second wires 220. The first pads 311 and the second pads 312 may be arranged in the first direction away from the active area AA. For example, the first pads 311 and the second pads 312 are alternately arranged along the first direction.

The first pads 311 and the second pads 312 may be included in one column. According to the exemplary embodiment, the first pads 311 and the second pads 312 are arranged alternately with each other to form a plurality of columns, which are arranged in the second direction. For example, as shown in FIG. 4, two first pads 311 and two second pads 312 are arranged alternately with each other to form one column in the first direction, and a plurality of columns formed in the above manner are arranged in the second direction. In FIG. 4, four pads form one column, but are not limited thereto. In another exemplary embodiment, one or more first pads 311 and one or more second pads 312 form a column.

The first pads 311 and the second pads 312 may be arranged in the second direction to be adjacent to the same kinds. For example, the first pads 311 are arranged in the second direction to form at least one row, and the second pads 312 are arranged in the second direction to form at least one row. In addition, rows of the first pads 311 and rows of the second pads 312 may be arranged alternately with each other to form a plurality of rows.

Since the first wires 210 and the second wires 220 adjacent to each other are formed in different layers and the first pads 311 and the second pads 312 connected to the first wires 210 and the second wires 220 are alternately arranged in the first direction so as to generate sections OL1 in which the first pads 311 and the second pads 312 overlap each other, a lot of pads 311 and 312 may be disposed within a narrow space having a first width W1 without generating electric short-circuits between the first and second wires 210 and 220. The above structure may be suitable to a display device of high resolution.

In FIG. 4, the first pads 311 and the second pads 312 arranged in the first direction are arranged on a coaxial line, but are not limited thereto. According to another exemplary embodiment, as shown in FIG. 5, the first pads 311 and the second pads 312 are arranged alternately with each other in the first direction, and may be shifted in the second direction so as to generate overlapping sections OL2.

Referring to FIGS. 5 and 6, since the first wires 210 and the second wires 220 adjacent to each other are arranged in different layers from each other, and the first pads 311 and the second pads 312 respectively connected to the first wires 210 and the second wires 220 are alternately disposed in the first direction so as to generate the overlapping sections OL2, a lot of pads 311 and 312 and first and second wires 210 and 220 may be disposed within a narrow space having a first width W1 without generating electric short-circuits between the first and second wires 210 and 220. Thus, a display device of high resolution may be manufactured.

Referring to FIG. 7, the first wire 210 is disposed on the gate insulating layer 103, and the first pad 311 is disposed on a different layer from the first wire 210 with the first insulating layer 105 interposed between the first wire 210 and the first pad 311. For example, the first pad 311 is disposed over the first wire 210 with the first insulating layer 105 interposed therebetween. According to the exemplary embodiment, the first wire 210 is located on the same layer as the gate electrodes 122 and 132 of the first and second thin film transistors 120 and 130 described above with reference to FIG. 3 and/or the first electrode 141 of the storage capacitor 140. In addition, the first pad 311 may be located on the same layer as the second electrode 142 of the storage capacitor 140 described above with reference to FIG. 3.

The first pad 311 is patterned as an island type, and is arranged to overlap the first wire 210, e.g., an end portion of the first wire 210. Since the first insulating layer 105 is disposed between the first wire 210 and the first pad 311, the first wire 210 and the first pad 311 are electrically insulated from each other. The first wires 210 and the first pads 311 are electrically connected via a first connecting portion (or first connecting layer) 321 that is located on a different layer from the first wire 210 and the first pad 311.

The first connecting portion 321 is located over the first wire 210 and the first pad 311, and the second insulating layer 106 is disposed between the first connecting portion 321 and the first pad 311. According to one exemplary embodiment, the first connecting portion 321 is formed on the same layer as the source electrodes 123 and 133 and the drain electrodes 124 and 134 of the first and second thin film transistors 120 and 130 described above with reference to FIGS. 2 and 3 and/or the data lines DL.

A part 321a of the first connecting portion 321 contacts the first wire 210 and the first pad 311 so that the first wire 210 and the first pad 311 may be electrically connected to each other. The part 321a of the first connecting portion 321 may contact the first pad 311 via a second hole H2 formed in the second insulating layer 106, and may contact the first wire 210 via a first hole H1 formed in the first insulating layer 105.

The first hole H1 and the second hole H2 overlap each other so that the first connecting portion 321 may simultaneously contact both the first wire 210 and the first pad 311. That is, a connecting point between the first connecting portion 321 and the first wire 210 and a connecting point between the first connecting portion 321 and the first pad 311 may overlap each other. Here, the first pad 311 includes a first through hole TH1 overlapping the first and second holes H1 and H2 so that the part 321a of the first connecting portion 321 may contact the first wire 210.

The second hole H2 is formed such that the size of the second hole H2 is greater than that of the first through hole TH1, and thus the first connecting portion 321 may contact an upper surface of the first pad 311 partially, as well as a side surface of the first pad 311.

The planarization layer 107 may be formed on the first connecting portion 321, and the planarization layer 107 may include an opening OP at a location corresponding to the first connecting portion 321. The first connecting portion 321 may be exposed to outside via the opening OP, and a driver IC D-IC may be bonded onto the first connecting portion 321 by an adhesive material including a conductive ball.

Referring to FIG. 8, the second wire 220 is disposed on the first insulating layer 105, and the second pad 312 is disposed at a different layer from the second wire 220 while the first insulating layer 105 is disposed between the second wire 220 and the second pad 312. For example, the second pad 312 is disposed under the second wire 220 while the first insulating layer 105 is disposed between the second pad 312 and the second wire 220. The second wire 220 may be disposed on the same layer as the first pad 311, and the second pad 312 may be disposed on the same layer as the first wire 210. According to the exemplary embodiment, the second pad 312 is disposed on the same layer as the gate electrodes 122 and 132 of the first and second thin film transistors 120 and 130 described above with reference to FIG. 3 and/or the first electrode 141 of the storage capacitor 140. In addition, the second wire 220 may be located on the same layer as the second electrode 142 of the storage capacitor 140 described above with reference to FIG. 3.

The second pad 312 may be patterned as an island type, and is disposed to overlap the second wire 220, e.g., an end portion of the second wire 220. Since the first insulating layer 105 is disposed between the second wire 220 and the second pad 312, the second wire 220 and the second pad 312 are electrically insulated from each other. The second wire 220 and the second pad 312 may be electrically connected to each other via a second connecting portion (or second connecting layer) 322 located on a different layer therefrom.

The second connecting portion 322 is disposed over the second wire 220 and the second pad 312, and the second insulating layer 106 is disposed between the second connecting portion 322 and the second wire 220. The second connecting portion 322 may be disposed on the same layer as the first connecting portion 321. According to the exemplary embodiment, the second connecting portion 322 is formed on the same layer as the source electrodes 123 and 133 and the drain electrodes 124 and 134 of the first and second thin film transistors 120 and 130 described above with reference to FIGS. 2 and 3 and/or the data lines DL.

A part 322a of the second connecting portion 322 contacts the second wire 220 and the second pad 312 so that the second wire 220 and the second pad 312 may be electrically connected to each other. The part 322a of the second connecting portion 322 may contact the second wire 220 via a fourth hole H4 formed in the second insulating layer 106, and may contact the second pad 312 via a third hole H3 formed in the first insulating layer 105.

The third hole H3 and the fourth hole H4 overlap each other, and the second connecting portion 322 may simultaneously contact both the second wire 220 and the second pad 312. That is, a connecting point between the second connecting portion 322 and the second wire 220 and a connecting point between the second connecting portion 322 and the second pad 312 may overlap each other. Here, the second wire 220 may include a second through hole TH2 overlapping the third hole H3 and the fourth hole H4 so that the part 322a of the second connecting portion 322 may contact the second pad 312.

The fourth hole H4 is formed such that the size of the fourth hole H4 is greater than that of the second through hole TH2, and thus the second connecting portion 322 may contact an upper surface partially, as well as a side surface of the second wire 220.

The planarization layer 107 may be formed on the second connecting portion 322, and the planarization layer 107 may include an opening OP at a location corresponding to the second connecting portion 322. The second connecting portion 322 may be exposed to outside via the opening OP, and the driver IC D-IC may be bonded onto the second connecting portion 322 by an adhesive material including a conductive ball.

As shown in FIGS. 7 and 8, since the height from the substrate 100 to the first connecting portion 321 and the height from the substrate 100 to the second connecting portion 322 are substantially equal to each other, a bonding defect of the driver IC D-IC caused by a height variation of the pad portion 300 may be prevented.

Although not shown in the drawings, according to another exemplary embodiment, a conductive protective layer may be further disposed on the first connecting portion 321 and the second connecting portion 322 located on the pad portion 300. Although not limited thereto, the conductive protective layer may include transparent conductive oxide selected from a group consisting of indium tin oxide (ITO), indium zinc oxide (IZO), zinc oxide (ZnO), indium oxide ($In_2O_3$), indium gallium oxide (IGO), and aluminum zinc oxide (AZO). The conductive protective layer may prevent corrosion of the first connecting portion 321 and the second connecting portion 322.

The display device according to one or more exemplary embodiments may prevent a bonding defect between the pads and the driver IC, reduce intervals between the wires, and increase an efficiency of arranging the pads.

It should be understood that exemplary embodiments described herein should be considered in a descriptive sense only and not for purposes of limitation. Descriptions of features or aspects within each exemplary embodiment should typically be considered as available for other similar features or aspects in other exemplary embodiments.

While the inventive technology has been described with reference to the figures, it will be understood by those of ordinary skill in the art that various changes in form and details may be made therein without departing from the spirit and scope as defined by the following claims.

What is claimed is:

1. A display device, comprising:
   a substrate comprising an active area including a plurality of pixels and an inactive area adjacent to the active area;
   a first wire disposed in the inactive area of the substrate;
   a first pad overlapping the first wire in the depth dimension of the display device;
   a first connecting layer configured to electrically connect the first wire to the first pad;
   a second wire located on a different layer from the first wire, wherein the second wire is located adjacent to the first wire;
   a second pad overlapping the second wire in the depth dimension of the display device; and
   a second connecting layer configured to electrically connect the second wire to the second pad.

2. The display device of claim 1, wherein the first and second pads are located on different layers.

3. The display device of claim 1, wherein the first and second connecting layers are located on the same layer.

4. The display device of claim 1, wherein the first wire and the second pad are located on the same layer, and wherein the second wire and the first pad are located on the same layer.

5. The display device of claim 1, wherein the first connecting layer is located over the first wire and the first pad, and wherein the second connecting layer is located over the second wire and the second pad.

6. The display device of claim 1, wherein the first connecting layer contacts the first wire and the first pad, and wherein the second connecting layer contacts the second wire and the second pad.

7. The display device of claim 1, further comprising:
   a first insulating layer interposed between the first wire and the first pad, wherein the first insulating layer has a first hole; and
   a second insulating layer interposed between the first pad and the first connecting layer, wherein the second insulating layer has a second hole, and
   wherein the first and second holes overlap each other in the depth dimension of the display device.

8. The display device of claim 7, wherein the first connecting layer contacts the first wire via the first hole and contacts the first pad via the second hole.

9. The display device of claim 7, wherein the first pad has a first through hole overlapping the first and second holes in the depth dimension of the display device.

10. The display device of claim 9, wherein the second hole is larger than the first through hole.

11. The display device of claim 1, further comprising:
    a first insulating layer interposed between the second pad and the second wire, wherein the first insulating layer has a third hole; and
    a second insulating layer interposed between the second wire and the second connecting layer, wherein the second insulating layer has a fourth hole, and
    wherein the third and fourth holes overlap each other in the depth dimension of the display device.

12. The display device of claim 11, wherein the second wire has a second through hole overlapping the third and fourth holes in the depth dimension of the display device.

13. The display device of claim 12, wherein the fourth hole is larger than the second through hole.

14. The display device of claim 1, further comprising:
    a thin film transistor located on the active area and comprising an active layer, a gate electrode, a source electrode, and a drain electrode; and
    a storage capacitor located on the active area and comprising a first electrode and a second electrode disposed on the first electrode.

15. The display device of claim 14, wherein the first wire and the second pad are located on the same layer as the gate electrode and the first electrode.

16. The display device of claim 14, wherein the second wire and the first pad are located on the same layer as the second electrode.

17. The display device of claim 1, wherein the first and second wires are electrically connected to signal lines passing through the active area.

18. The display device of claim 1, wherein the first pad comprises a plurality of first sub-pads, wherein the second pad comprises a plurality of second sub-pads, and wherein the first sub-pads and the second sub-pads are alternately arranged in a first direction.

19. The display device of claim 1, wherein the first wire includes a plurality of first sub-wires, wherein the second wire includes a plurality of second sub-wires, and wherein the first sub-wires and the second sub-wires are alternately arranged.

20. A display device, comprising:
- a substrate comprising a display area including a plurality of pixels and a non-display area adjacent to the display area;
- first and second wires disposed in the non-display area and located on different layers formed over the substrate;
- a first pad overlapping the first wire in the depth dimension of the display device;
- a second pad overlapping the second wire in the depth dimension of the display device,
- a first connecting layer configured to electrically connect the first wire to the first pad; and
- a second connecting layer configured to electrically connect the second wire to the second pad,
- wherein the first and second wires are alternately arranged in parallel, and wherein the first and second pads are alternately arranged at corresponding ends of the first and second wires.

* * * * *